United States Patent
Dong et al.

(10) Patent No.: US 7,420,791 B1
(45) Date of Patent: Sep. 2, 2008

(54) FAULT SIGNATURE SYSTEM FOR POWER MANAGEMENT INTEGRATED CIRCUITS

(75) Inventors: Wei Dong, Cary, NC (US); Kun Xing, Cary, NC (US); Eric M. Solie, Durham, NC (US)

(73) Assignee: Intersil Americas Inc., Milpitas, CA (US)

( * ) Notice: Subject to any disclaimer, the term of this patent is extended or adjusted under 35 U.S.C. 154(b) by 283 days.

(21) Appl. No.: 10/914,472

(22) Filed: Aug. 9, 2004

(51) Int. Cl.
*H02H 3/20* (2006.01)
*H02H 3/24* (2006.01)

(52) U.S. Cl. ................................................. 361/90
(58) Field of Classification Search .................. 361/90
See application file for complete search history.

(56) References Cited

U.S. PATENT DOCUMENTS

| | | | | |
|---|---|---|---|---|
| 4,803,592 A | * | 2/1989 | Ashley | 361/79 |
| 4,951,171 A | * | 8/1990 | Tran et al. | 361/90 |
| 4,962,350 A | * | 10/1990 | Fukuda | 323/283 |
| 5,063,516 A | * | 11/1991 | Jamoua et al. | 701/114 |
| 5,173,832 A | * | 12/1992 | Giorgetta et al. | 361/88 |
| 5,235,261 A | * | 8/1993 | Philipp | 318/504 |
| 5,291,384 A | * | 3/1994 | Mammano et al. | 363/17 |
| 5,498,912 A | * | 3/1996 | Templeman et al. | 307/115 |
| 6,292,911 B1 | * | 9/2001 | Swanson | 714/715 |
| 6,314,550 B1 | * | 11/2001 | Wang et al. | 716/17 |
| 6,919,747 B2 | * | 7/2005 | Baker | 327/198 |

\* cited by examiner

*Primary Examiner*—Michael J Sherry
*Assistant Examiner*—Ann T Hoang
(74) *Attorney, Agent, or Firm*—Gary R Stanford (57) ABSTRACT

A power management IC including a dual purpose pin, a fault detection system, and a fault signature system. The dual purpose pin performs a power management function during normal operation (e.g., a soft start pin coupled to an external capacitor, a set pin coupled to an external resistor, a frequency set pin coupled to a resistor-capacitor combination, etc.). The fault detection system senses any of multiple fault conditions and provides a corresponding fault indicator signal, each indicating a corresponding fault condition. The fault signature system generates a selected fault signature signal on the dual purpose pin, where each fault signature signal has a characteristic indicative of a corresponding fault condition. Thus, an existing pin on the IC is re-used to indicate the fault condition. The fault signature signal may be a unique voltage level, a unique charging rate, a unique frequency signal, or any a combination thereof.

29 Claims, 9 Drawing Sheets

FAULT SIGNATURE SYSTEM FOR POWER MANAGEMENT INTEGRATED CIRCUITS

BACKGROUND OF THE INVENTION

1. Field of the Invention

The present invention relates to power management controller integrated circuits (ICs), and more particularly to a fault indicator system for a power management IC in which an existing pin performing a power management function is re-used to report different fault conditions using corresponding fault signatures that identify the type of protection fault.

2. Description of the Related Art

Power controller ICs or chips are typically designed to enter a shut-down protection condition in the event of several general fault conditions, such as output under-voltage, over-current and input voltage out of range. The majority of commercial power management ICs, however, usually include only one pin dedicated to indicate the fault protection or to provide a simple power status monitor, such as the power good (PGOOD) pin or the like. Because of IC pin and spacing limitations, it is disadvantageous to add another external pin to provide fault identification. The PGOOD pin is either pulled high (e.g., logic TRUE) during normal operation or pulled low (e.g., logic FALSE) during a fault condition. Otherwise, the IC provides no additional information about the particular fault condition that initiated shut-down protection or that caused the fault indication.

Knowledge of the cause of shut-down protection is useful for the designers of the power controller as well as system designers of power systems that use the power controller IC. From the system designer's point of view, whenever a shut-down happens or when the power good signal is de-asserted, the system designer needs to know the root cause of the shutdown so that the proper actions can be taken to correct the problem, such as increasing over-current threshold, increasing the output capacitor, changing the layout, etc. From the IC design point of view, knowing the exact cause of the shut-down or fault can help to diagnose whether the root cause is related to internal IC design (and thus usable to improve IC design) or whether it is a field application issue.

The debugging and probing efforts are often very time consuming when an unexpected shut-down happens, especially for those faults triggered by the probability of a combination of events. For example, it has been reported that it may take on the order of tens of hours or even days to diagnose a single shut-down event. The power management IC is usually installed on a motherboard or the like with many high-speed digital devices. Since troubleshooting measurements are relatively sensitive, the noise resulting from the digital circuits and the power conversion circuit complicates the measurement. The noise in a motherboard environment further increases the difficulty of identifying the root cause. In order to identify the root cause of the fault protection related shut-down, it is usually mandatory to measure multiple points of the circuit.

It is desired to provide more detailed fault indication information for power management or controller ICs with limited pin and spacing requirements without interfering with the function of the power good pin. Such feature may be applied in a generic manner to existing power controller chips, such as the ISL6227, ISL6269 and ISL6260 chips manufactured by Intersil Corporation, the MAX1999 manufactured by Maxim Integrated Products, Inc., the SC1486 manufactured by Semtech Corporation, among other power management controllers.

SUMMARY OF THE INVENTION

A power management integrated circuit (IC) according to an embodiment of the present invention includes a dual purpose pin, a fault detection system, and a fault signature system coupled to the dual purpose pin. The dual purpose pin performs a power management function during normal operation. The fault detection system senses any of multiple fault conditions and provides a corresponding fault indicator signal, where each fault indicator signal indicates a corresponding fault condition. The fault signature system generates a selected fault signature signal on the dual purpose pin, where each fault signature signal has a characteristic indicative of a corresponding fault condition.

In one embodiment, the fault detection system includes multiple fault sensors, each including a comparator and a latch. In a more particular embodiment, for example, the fault detection system includes a first comparator that compares an output voltage with an output under-voltage threshold and that provides an output under voltage signal to a first latch providing a first fault indicator signal, a second comparator that compares a sense current with an over-current threshold and that provides an over current signal to a second latch providing a second fault indicator signal, a third comparator that compares an input voltage with an input over-voltage threshold and that provides an input over-voltage signal, a fourth comparator that compares the input voltage with an input under-voltage threshold and that provides an input under-voltage signal, and a logic gate that receives the input over-voltage and input under-voltage indicator signals and that provides an input voltage out-of-range signal to a third latch providing a third fault indicator signal.

The characteristic of the fault signature signal depends upon the particular implementation and may depend upon the selected dual purpose pin. In one embodiment, each fault signature signal has a unique signal waveform indicative of a corresponding fault condition. In another embodiment, each fault signature signal develops a unique voltage level indicative of a corresponding fault condition. In various embodiments, one or more external components are coupled to the dual purpose pin in order to perform the power management function. The IC may include multiple internal components, each corresponding to a fault condition, and multiple switches, each internally coupling the dual purpose pin to a corresponding internal component in response to assertion of a corresponding fault indicator signal. In these cases, each fault indicator signal controls a corresponding switch to create a selected combination of internal and external components to generate a selected fault signature signal on the dual purpose pin. In one embodiment, each selectable combination is a resistive-capacitive combination with a unique timing constant. In another embodiment, each selectable combination is a voltage divider combination that develops a unique voltage level. In yet another embodiment, each selectable combination is a resistive and current source combination that achieves a characteristic voltage level. In more specific embodiments, the pin is a selected one of a soft start pin, an over-current set pin, a frequency set pin, etc., coupled to an external capacitor, an external resistor, or combination thereof.

A power system according to an embodiment of the present invention includes a printed circuit board (PCB), and a power switching circuit and a power management chip each mounted on the PCB. The power management chip includes a dual purpose pin and controls the power switching circuit to convert an input voltage to a regulated output voltage. The dual purpose pin performs a power management function during normal operation and provides a fault signature signal for each of a plurality of fault protection modes. In one embodiment, the dual purpose pin is a soft start pin coupled to an external capacitor, which charges to a predetermined voltage level during normal operation and which discharges at a characteristic rate indicative of a fault protection mode. In another embodiment, the dual purpose pin is an over current set pin coupled to a set resistor, where the set pin develops a characteristic voltage level indicative of a fault protection mode. In yet another embodiment, the dual purpose pin is a frequency set pin, coupled to a resistor and a capacitor, which develops a characteristic voltage level indicative of a fault protection mode. Or, the frequency set pin is coupled to a resistor and a capacitor for developing an initial voltage during normal operation and for charging at a characteristic rate indicative of a fault protection mode.

A method of indicating specific fault information of a power management chip by re-using an external pin of the chip according to an embodiment of the present invention includes internally detecting each of multiple fault conditions, and generating a fault signal on the external pin with a unique signature indicative of the detected fault condition. The method may include comparing each of multiple power management signals with a corresponding reference threshold, and providing multiple fault indications, each indicative of a corresponding power management signal meeting its reference threshold. The method may further include coupling an external device associated with the predetermined power management function to the external pin, and internally coupling the external pin to a corresponding one of multiple unique internal devices. In this latter case, the method may include coupling to at least one source device which causes a corresponding one of multiple unique voltage levels to develop on the external pin. For example, the method may include coupling to a corresponding one of multiple unique source devices, or coupling to a corresponding one of multiple of unique voltage divider devices coupled to a voltage source.

The method may further include applying a predetermined condition associated with a predetermined power management function on the external pin, and changing the predetermined condition in a unique manner. In one such embodiment, the method includes charging the external pin to an initial voltage level and discharging voltage at a unique rate. In another, the method includes applying an initial voltage level and changing to a unique voltage level or changing voltage level at a unique rate. The method may further include coupling a source device to the external pin, and decoupling the source from the external pin in response to providing a corresponding fault indication.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
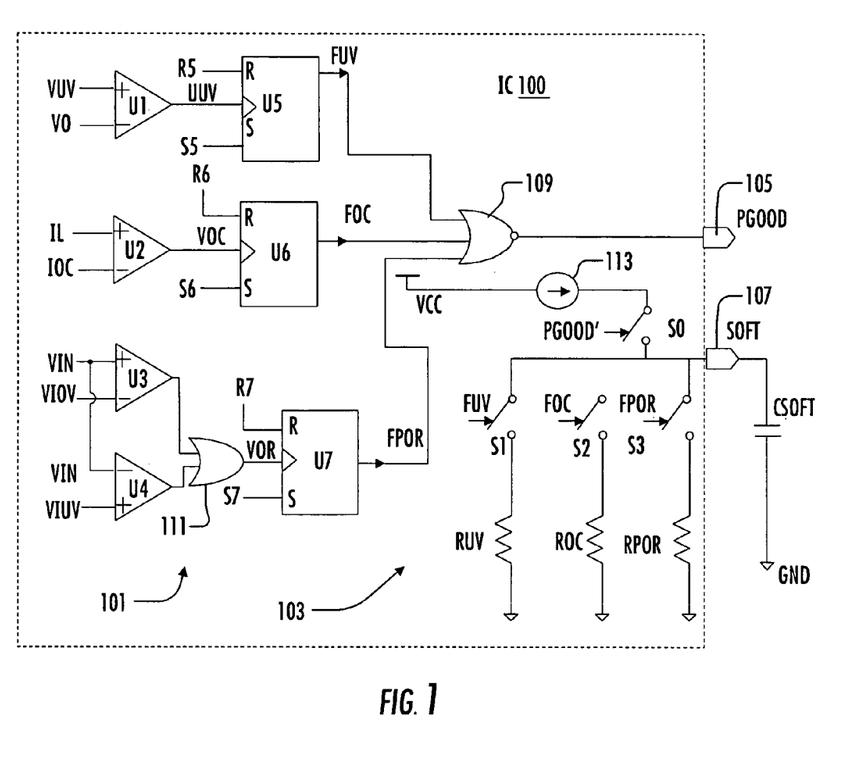
FIG. 1 is simplified schematic diagram of a power management chip or IC including an exemplary fault indicator system according to an embodiment of the present invention.

FIG. 1 is simplified schematic diagram of a power management chip or integrated circuit (IC) 100 including an exemplary fault indicator system according to an embodiment of the present invention. The IC 100 has two existing external pins including a power good (PGOOD) pin 105 and a soft start (SOFT) pin 107. As used herein, the name of a node or pin is also the name of the signal it carries unless otherwise indicated. Thus, the PGOOD pin 105 provides the PGOOD signal and the SOFT pin 107 provides a corresponding SOFT signal. Upon startup of the IC 100 (e.g., reset and/or powered on and initialized), the PGOOD pin 105 is pulled high to initiate normal operation. When a fault condition is detected, as further described below, the PGOOD pin 105 is pulled low and the IC 100 shuts down or otherwise enters a protection mode. It is noted that the external functionality of the PGOOD signal remains unchanged.

Many power management ICs include a soft start function that allows a system designer to control the rate of ramp up of the output voltage V0 (FIG. 9) into regulation to avoid potentially damaging transients or power surges or the like. An external capacitor, CSOFT, is coupled between the SOFT pin 107 of the IC 100 and a common reference node (e.g., ground or GND) to program the soft start function. The IC 100 delivers a known current via the SOFT pin 107 and the designer selects a value of CSOFT (e.g., 10 nanofarads (nF)) so that the voltage of the SOFT pin 107 ramps up at the desired rate. The voltage of the SOFT pin 107 is internally used in the regulation loop so that the output voltage V0 generally follows the ramping voltage on the SOFT pin 107 during the soft start process until the voltage reaches a predetermined level and the IC 100 enters normal regulation mode. In many designs, the SOFT pin 107 is not otherwise used during normal operation. In the event of a fault condition or shutdown, the capacitor CSOFT is discharged via the SOFT pin 107 as further described below.

The fault indicator system includes a sensor or detector system 101 that senses and internally indicates each of multiple fault conditions, and a fault signature system 103 that generates a fault signal with a unique signature or characteristic to externally indicate the type of fault. In the embodiments illustrated, the detector system 101 includes multiple comparators U1-U4, each for comparing a power management signal or value with one or more reference or threshold signal levels defining operating levels between normal and abnormal. The first comparator U1 operates as an output under-voltage sensor which compares the output voltage V0 received at its inverting input with an under-voltage threshold VUV received at its non-inverting input. The comparator U1 provides an under-voltage signal UUV at its output to the clock input of a set-reset latch U5. The reset (R) input of the latch U5 receives a reset signal R5 and the set input (S) receives a set signal S5. The output of the latch U5 provides a binary or digital under-voltage fault signal FUV, which is provided to one input of a three-input NOR gate 109. The output of the NOR gate 109 provides the PGOOD signal which is asserted on the PGOOD pin 105. The second comparator U2 operates as an over-current sensor which compares the current through the output inductor L (FIG. 9) indicated by a current sense voltage IL received at its non-inverting input with an over-current threshold IOC received at its inverting input. The comparator U2 provides an over-current signal VOC at its output to the clock input of another set-reset latch U6. The output of the latch U6 provides a binary or digital over-current fault signal FOC provided to a second input of the NOR gate 109. The reset (R) and set (S) inputs of the latch U6 receive reset R6 and set S6 signals in a similar manner as the latch U5.

The third comparator U3 operates as an input over-voltage sensor which compares an input voltage VIN received at its non-inverting input with an input over-voltage threshold VIOV received at its inverting input. The comparator U3 provides an input over-voltage signal at its output to one input of a two-input OR gate 111. The fourth comparator U4 operates as an input under-voltage sensor which compares VIN received at its inverting input with an input under-voltage threshold VIUV received at its non-inverting input. The comparator U4 provides an input under-voltage signal at its output to the other input of the OR gate 111. The OR gate 111 provides an input out-of-range signal VOR to the clock input of another set-reset latch U7. The output of the latch U7 provides a binary or digital out-of-range voltage fault signal FPOR to a third input of the NOR gate 109. The reset (R) and set (S) inputs of the latch U7 receive reset R7 and set S7 signals in a similar manner as the latches U5 and U6.

In operation of the detector system 101, during startup of the IC 100, the latches U5-U7 are controlled by the R5-R7 and S5-S7 signals until the IC 100 reaches a steady state power condition. When the IC 100 reaches regulation, the R5-R7 signals are pulsed or toggled to reset the latches U5-U7, respectively, to initiate normal operation. The S5-S7 signals are held high at a logic one during normal operation to latch a logic one provided at the respective inputs of the latches U5-U7 in the event of a fault condition. The FUV, FOC and FPOR signals are eventually pulled low and the PGOOD signal is pulled or otherwise remains asserted high indicating the start of normal operation.

During normal regulation operation, the VO signal stays above the VUV threshold so that UUV remains low. If VO falls below VUV at any time indicating an output undervoltage fault condition, then the comparator U1 asserts UUV high to clock the latch U5, which latches the logic one level of S5 and asserts the FUV fault signal high. The NOR gate 109 responds by de-asserting the PGOOD signal/pin low. During normal operation, the IL signal stays below the IOC threshold so that VOC remains low. If the IL signal rises above IOC at any time indicating an over-current fault condition, then the comparator U2 asserts VOC high to clock the latch U6, which latches the logic one level of S6 and asserts the FOC fault signal high. The NOR gate 109 responds by de-asserting the PGOOD signal/pin low. During normal operation, the VIN signal stays between the VIOV and VIUV thresholds so that VOR remains low. If the VIN signal rises above VIOV at any time indicating an input over-voltage fault condition, then the comparator U3 asserts its output high and the OR gate asserts VOR high to clock the latch U7, which latches the logic one level of S7 and asserts the FPOR fault signal high. If the VIN signal falls below VIUV at any time indicating an input undervoltage fault condition, then the comparator U4 asserts its output high and the OR gate asserts VOR high to clock the latch U7, which asserts the FPOR fault signal high. The NOR gate 109 responds to FPOR asserted high by de-asserting the PGOOD signal/pin low.

For the fault signature system 103, a single-pole, single-throw (SPST) switch S0 is controlled by a signal PGOOD' and coupled between a current source 113 and the SOFT pin 107. The switch S0 is open when PGOOD' is de-asserted low and is closed when PGOOD' is asserted high. The PGOOD' signal is derived from, and, for purposes of fault detection and protection, is essentially the same signal as the PGOOD signal. The exception is during startup of the IC 100, where the PGOOD' signal is asserted high when the IC 100 is enabled (e.g., when an IC ENABLE signal (not shown) is provided to the IC 100) while the PGOOD signal/pin remains de-asserted low so that the soft-start function is enabled while the PGOOD signal is low. After the soft-start process, the PGOOD' signal has the same logic level as the PGOOD signal (e.g., PGOOD' is the product of ENABLE and PGOOD after startup) during normal operation and during the fault protection modes. The current source 113 is coupled to and biased by a source voltage, such as VCC (an input power signal of the IC 100), and provides a predetermined current to the SOFT pin 107 when the switch S0 is closed by PGOOD'. Thus, when PGOOD' is asserted high, the power management soft-start function is enabled so that the current source 113 charges the CSOFT capacitor at a rate determined by the size of the CSOFT capacitor. When the voltage of the SOFT pin 107 reaches a predetermined level, the IC 100 begins regulating and the voltage of the SOFT pin 107 obtains a steady-state voltage level, referred to as $V_{CSOFT}(0)$, and remains at that level until powered off or a fault condition is detected. If any of the fault conditions occur, such as the output over-voltage fault condition causing FUV to go high, or the over-current fault condition causing FOC to go high, or the input voltage out-of-range fault condition causing the FPOR signal to go high, the PGOOD and PGOOD' signals are de-asserted low opening the switch S0. As described below, the capacitor CSOFT discharges from $V_{CSOFT}(0)$ at a characteristic rate indicative of the particular type of fault that occurred, so that the SOFT signal on the SOFT pin 107 exhibits a signature waveform indicative of the fault condition that occurred. Thus, the SOFT pin 107, normally used for the soft-start function, is a dual purpose pin which is re-used to indicate the fault condition.

In the embodiment illustrated by the IC 100, the FUV, FOC and FPOR fault signals control a set of SPST switches S1, S2 and S3, respectively, each having one pole internally coupled to the SOFT pin 107. The other pole of switch S1 is coupled to one end of a resistor RUV, the other pole of switch S2 is coupled to one end of a resistor ROC, and the other pole of switch S3 is coupled to one end of a resistor RPOR. The other ends of the resistors RUV, ROC and RPOR are coupled to GND. Each of the switches S1-S3 are opened when the corresponding fault signal is de-asserted low and closed when the corresponding fault signal is asserted high. In normal operation, switch S0 is closed and the switches S1-S3 are open enabling normal soft-start operation so that the capacitor CSOFT charges to the $V_{CSOFT}(0)$ voltage level. If the output over-voltage fault condition occurs, PGOOD is de-asserted and FUV is asserted so that the capacitor CSOFT discharges from $V_{CSOFT}(0)$ to GND via the resistor RUV. If the over-current fault condition occurs, PGOOD is de-asserted and FOC is asserted so that the capacitor CSOFT discharges from $V_{CSOFT}(0)$ to GND via the resistor ROC. If the input voltage out-of-range fault condition occurs, PGOOD' is de-asserted and FPOR is asserted so that the capacitor CSOFT discharges from $V_{CSOFT}(0)$ to GND via the resistor RPOR. In this case, the resistors RUV, ROC and RPOR have sufficiently different resistances to provide three separate and distinguishable discharge rates externally detectable and measurable at the SOFT pin 107. In one embodiment, for example, the resistors RUV, ROC and RPOR are differently sized by a factor of ten, such as RUV=100 kilohms (kΩ), ROC=10Ω, and RPOR=1 kΩ, resulting in corresponding slow, medium and fast discharge rates of the capacitor CSOFT.

Figure 2:
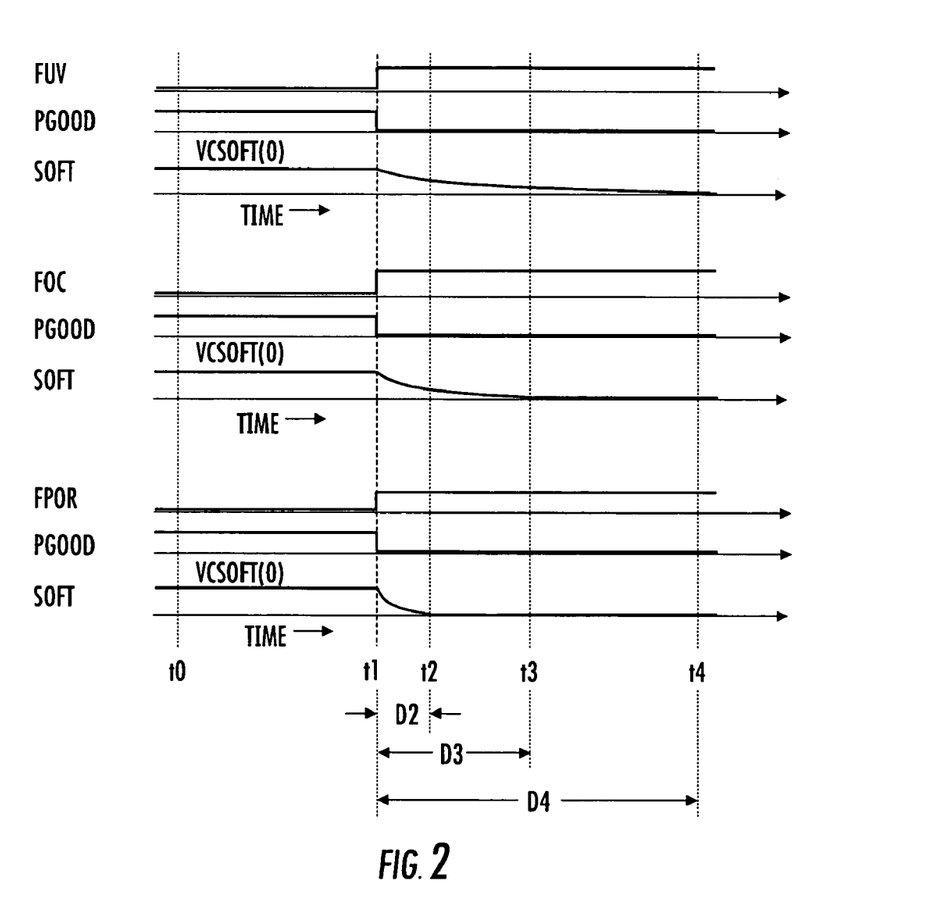
FIG. 2 includes three timing diagrams illustrating operation of the exemplary fault indicator system of the IC of FIG. 1 for the three separate fault condition cases, namely, the output over-voltage fault condition, the over-current fault condition, and the input voltage out-of-range fault condition, respectively.

FIG. 2 includes three timing diagrams illustrating operation of the exemplary fault indicator system of the IC 100 for the three separate fault condition cases, namely, the output over-voltage fault condition, the over-current fault condition, and the input voltage out-of-range fault condition, respectively. In each timing diagram, a corresponding one of the fault signals FUV, FOC and FPOR is plotted versus time followed by plots of PGOOD and the SOFT signal provided on the SOFT pin 107. Recall that PGOOD indicates PGOOD' since they are essentially the same signals during normal operation after startup and during the fault protection modes. The three timing diagrams are aligned with each other to more clearly illustrate the differences in timing and rate of discharge of the voltage of the capacitor CSOFT shown by the SOFT signal. In each case, at an initial time t0 during normal operation, the SOFT signal is at the normal operating stable level $V_{CSOFT}(0)$. In the first timing diagram, at a time t1 the FUV signal is asserted high indicating an output under-voltage fault condition. The PGOOD signal is de-asserted low at time t1 providing an immediate external indication of the fault protection mode. The SOFT signal begins to drop at time t1 as the voltage of the capacitor CSOFT discharges through the resistor RUV. Since the resistor RUV is a relatively high-valued resistor, the rate of discharge is relatively slow so that the SOFT signal does not reach zero or GND level until a time t4. The rate of discharge of the capacitor CSOFT is governed by the following equation 1:

$$V_{CSOFT}(t-t1) = V_{CSOFT}(0) * e^{-(t-t1)/\tau} \quad (1)$$

where "t" is elapsed time, $V_{CSOFT}(X)$ is the voltage of the SOFT pin 107 at time "x" (where x=0 for time t1), the asterisk "*" denotes multiplication, and "τ" is the RC time constant, which equals RUV*CSOFT when the capacitor CSOFT discharges through the resistor RUV. The duration from time t1 to time t4 is shown as D4, which is a relatively long duration as compared to the other fault conditions.

In the second timing diagram, at time t1 the FOC signal is asserted high indicating an over-current fault condition. The PGOOD signal is de-asserted low at time t1 and the SOFT signal begins to drop as the voltage of the capacitor CSOFT discharges through the resistor ROC. Since the resistor ROC has a smaller resistance than the resistor RUV, the rate of discharge is faster as compared to the output under-voltage fault condition case, so that the SOFT signal reaches zero at a time t3 which is much sooner than time t4. The rate of discharge of the capacitor CSOFT is governed by equation 1 above where τ=ROC*CSOFT since the capacitor CSOFT discharges through the resistor ROC. The duration from time t1 to time t3, shown as D3, is shorter than the duration D4 resulting in a different and measurable characteristic associated with the over-current fault condition.

In the third timing diagram, at time t1 the FPOR signal is asserted high indicating an over-current fault condition. The PGOOD signal is de-asserted low at time t1 and the SOFT signal begins to drop as the voltage of the capacitor CSOFT discharges through the resistor RPOR. Since the resistor RPOR is significantly smaller in value than the resistor RUV, the rate of discharge is significantly faster as compared to the output under-voltage fault condition case, so that the SOFT signal reaches zero relatively quickly at a time t2. The rate of discharge of the capacitor CSOFT is governed by equation 1 above where τ=RPOR*CSOFT since the capacitor CSOFT discharges through the resistor RPOR. The duration from time t1 to time t2, shown as D2, is shorter than the duration D3 and significantly shorter than the duration D4, resulting in a different and measurable characteristic associated with the voltage out-of-range fault condition.

Figure 3:
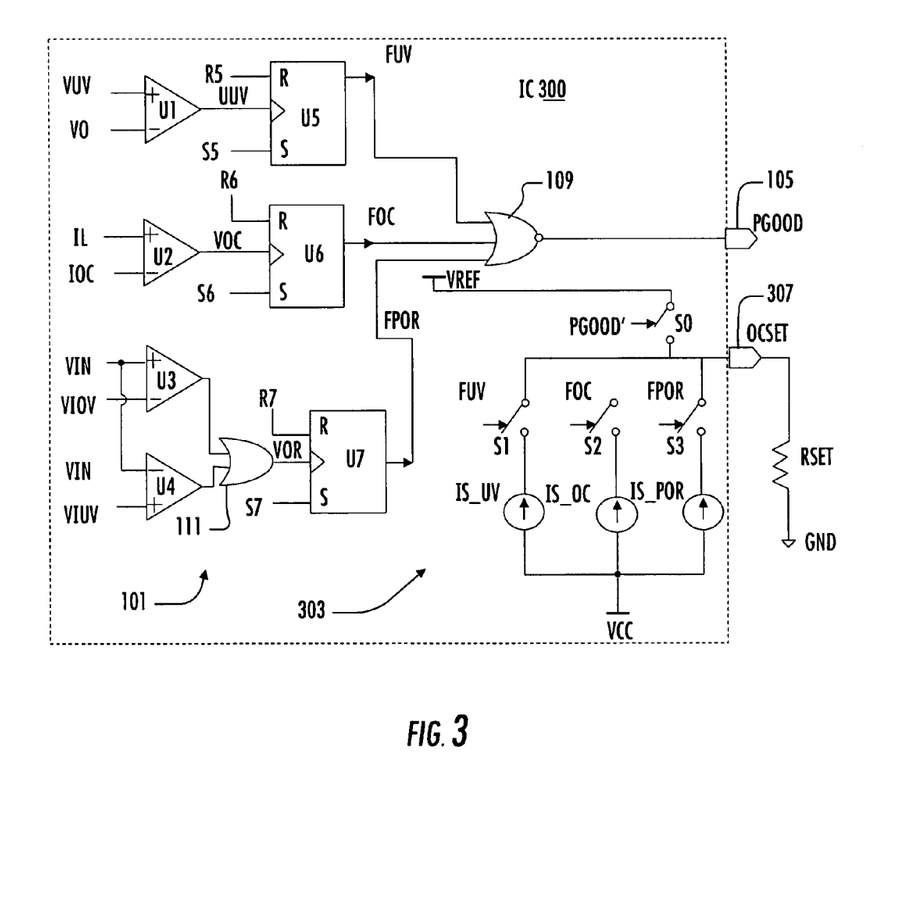
FIG. 3 is simplified schematic diagram of a power management chip or IC including an exemplary fault indicator system according to another embodiment of the present invention.

FIG. 3 is simplified schematic diagram of a power management chip or IC 300 including an exemplary fault indicator system according to another embodiment of the present invention. Similar components as those of the IC 100 assume identical reference numbers. The IC 300 includes the detection system 101 that operates in substantially identical manner as that of the IC 100, including the comparators U1-U4, the latches U5-U7 providing the FUV, FOC and FPOR fault signals, respectively, and the gates 111 and 109. The PGOOD pin 105 is again used for externally providing the PGOOD signal and the PGOOD' signal is the same as the PGOOD signal during normal operation after startup and during the fault protection modes as previously described. The fault signature system 103 is replaced with a different signal signature system 303, which is coupled to another external pin of the IC 300. In this case, an over-current set (OCSET) pin 307 is used as the dual purpose pin instead of the SOFT pin 107. The OCSET pin 307 may be used for one or more standard or predetermined power management functions, such as, for example, setting the over-current threshold or setting the channel reference voltage used for regulation. When the OCSET pin 307 is used to set the over-current threshold, a set resistor RSET is externally coupled between the OCSET pin 307 and GND. The switch S0 is included and controlled by the PGOOD' signal, but its poles are instead coupled between an internal reference voltage VREF and the OCSET pin 307. In one embodiment, VREF is approximately 0.9 Volts (V) and RSET is 60 kΩ, where VREF is applied to RSET while PGOOD' is asserted high.

For the signal signature system 303, the FUV, FOC and FPOR fault signals control the switches S1, S2 and S3, respectively, each having one pole internally coupled to the OCSET pin 307. The other pole of switch S1 is coupled to one end of a current source IS_UV (providing a current signal IS_UV), the other pole of switch S2 is coupled to one end of a current source IS_OC (providing a current signal IS_OC), and the other pole of switch S3 is coupled to one end of a current source IS_POR (providing a current signal IS_POR). The other ends of the current sources IS_UV, IS_OC, and IS_POR are coupled to the voltage source VCC. As with the IC 100, each of the switches S1-S3 are opened when the corresponding fault signal is de-asserted low and closed when the corresponding fault signal is asserted high. In normal operation, switch S0 is closed and the switches S1-S3 are open so that the resistor RSET has an initial voltage of VREF. If the output over-voltage fault condition occurs, PGOOD' is de-asserted and FUV is asserted so that the current source IS_UV provides current to the resistor RSET. If the over-current fault condition occurs, PGOOD' is de-asserted and FOC is asserted so that the current source IS_OC provides current to the resistor RSET. If the input voltage out-of-range fault condition occurs, PGOOD' is de-asserted and FPOR is asserted so that the current source IS_POR provides current to the resistor RSET. The current sources IS_UV, IS_OC, and IS_POR provide sufficiently different current levels so that three separate and distinguishable voltage levels are developed on the OCSET pin 307 depending upon the type of fault protection. In one embodiment, for example, the current sources IS_UV, IS_OC, and IS_POR are differently sized by a factor of two, such as current level IS_UV=10 microamperes (μA), current level IS_OC=20 μA, and current level IS_POR=40 μA, resulting in corresponding low, medium and high (or first, second and third) voltage levels, respectively, on the OCSET pin 307.

Figure 4:
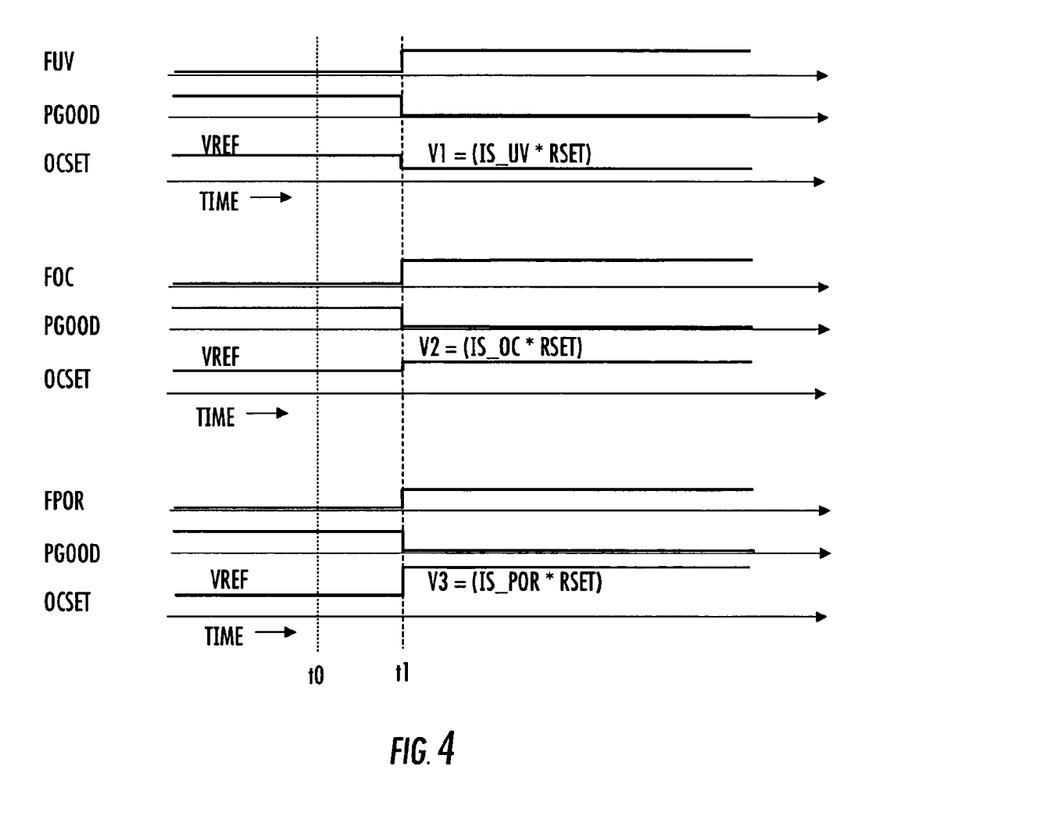
FIG. 4 includes three timing diagrams illustrating operation of the exemplary fault indicator system of the IC of FIG. 3 for the three separate fault condition cases, namely, the output over-voltage fault condition, the over-current fault condition, and the input voltage out-of-range fault condition, respectively.

FIG. 4 includes three timing diagrams illustrating operation of the exemplary fault indicator system of the IC 300 for the three separate fault condition cases, namely, the output over-voltage fault condition, the over-current fault condition, and the input voltage out-of-range fault condition, respectively, in a similar manner as the timing diagrams of FIG. 2 for the IC 100. In each timing diagram, a corresponding one of the fault signals FUV, FOC and FPOR is plotted versus time followed by plots of PGOOD and the voltage of the OCSET pin 303, shown as a signal OCSET. Again, the three timing diagrams are aligned with each other to more clearly contrast three different voltage levels developed on the OCSET pin 307 as a result of the corresponding fault condition. In each case, at an initial time t0 during normal operation, the voltage of the OCSET pin 303 is at VREF. In the first timing diagram, at a time t1 the FUV signal is asserted high indicating the output under-voltage fault condition. The PGOOD signal is de-asserted low at time t1 and the OCSET pin 303 changes to a steady-state voltage V1=(IS_UV*RSET). If IS_UV outputs 10 μA and RSET=60 kΩ, then V1=0.6V.

In the second timing diagram, at time t1 the FOC signal is asserted high indicating the over-current fault condition. The PGOOD signal is de-asserted low at time t1 and the voltage of the OCSET pin 307 changes to a steady-state voltage V2=(IS_OC*RSET). If IS_OC outputs 20 μA and RSET=60 kg, then V2=1.2V. Since the current source IS_OC generates twice the current as the current source IS_UV, V2 is twice the voltage of V1.

In the third timing diagram, at time t1 the FPOR signal is asserted high indicating the over-current fault condition. The PGOOD signal is de-asserted low at time t1 and the voltage of the OCSET pin 307 changes to a steady-state voltage V3=(IS_POR*RSET). If IS_POR outputs 40 μA and RSET=60 kΩ, then V3=2.4V. Since the current source IS_POR generates twice the current as the current source IS_OC, V3 is twice the voltage of V2, which is twice the voltage of V1. In this manner, three different voltage levels are used, where each voltage level is associated with a corresponding fault condition.

Figure 5:
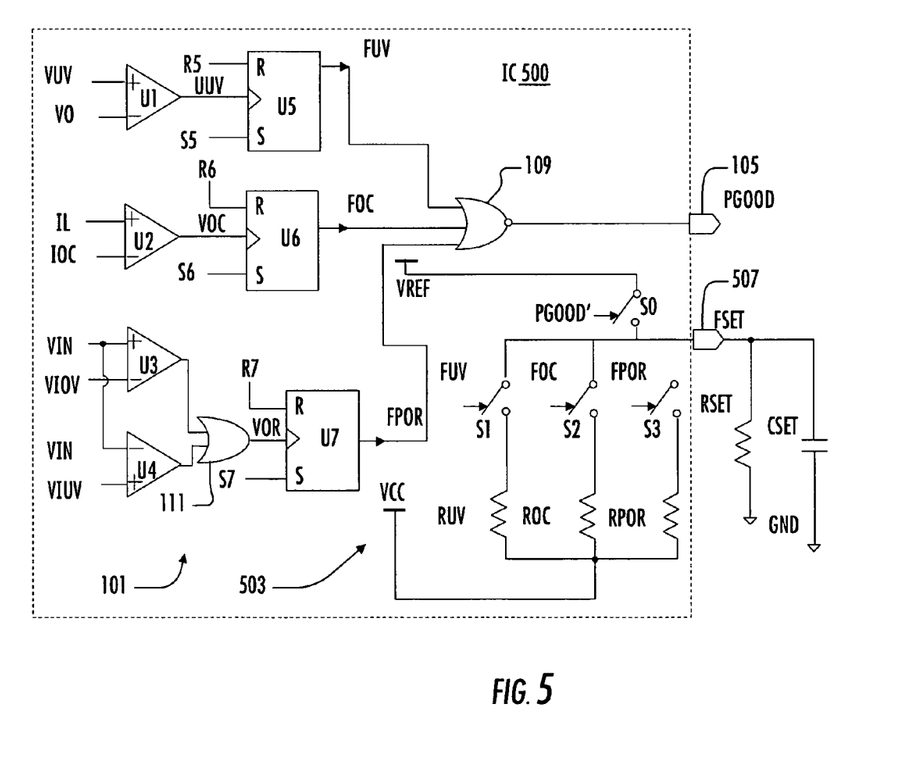
FIG. 5 is simplified schematic diagram of a power management chip or IC including an exemplary fault indicator system according to another embodiment of the present invention.

FIG. 5 is simplified schematic diagram of a power management chip or IC 500 including an exemplary fault indicator system according to another embodiment of the present invention. Similar components as those of the ICs 100 and 300 assume identical reference numbers. The IC 500 includes the detection system 101 that operates in substantially identical manner as that of the IC 100 for externally providing the PGOOD signal on the PGOOD pin 105 and PGOOD' follows PGOOD as previously described. The fault signature system 103 is replaced with a different signal signature system 503, which is coupled to another external pin of the IC 500. In this case, a frequency set (FSET) pin 507 is used as the dual purpose pin instead of the SOFT pin 107 or the OCSET pin 307. The FSET pin 507 is used by some power management controllers for allowing a designer to set the operating frequency of the IC 500 using an external a set resistor RSET and set capacitor CSET. As illustrated, RSET and CSET are coupled in parallel between the FSET pin 507 and GND. The switch S0 is included and controlled by the PGOOD' signal and coupled between VREF and the FSET pin 507. In one embodiment, VREF is 0.9V, RSET is 60 kΩ, and CSET is any appropriate capacitance for setting the desired operating frequency. VREF is applied to RSET and CSET while PGOOD' is asserted high closing the switch S0, so that CSET charges to and remains at the VREF voltage level during normal operation.

For the signal signature system 503, the FUV, FOC and FPOR fault signals control the switches S1, S2 and S3, respectively, each having one pole internally coupled to the FSET pin 507. The other pole of switch S1 is coupled to one end of a resistor RUV, the other pole of switch S2 is coupled to one end of a resistor ROC, and the other pole of switch S3 is coupled to one end of a resistor RPOR. The other ends of the resistors RUV, ROC and RPOR are coupled to the voltage source VCC. As with the IC 100, each of the switches S1-S3 are opened when the corresponding fault signal is de-asserted low and closed when the corresponding fault signal is asserted high. In normal operation, switch S0 is closed and the switches S1-S3 are open so that the FSET pin 507 has an initial voltage of VREF. If the output over-voltage fault condition occurs, PGOOD and PGOOD' are de-asserted and FUV is asserted so that the resistor RUV and the parallel combination of RSET and CSET form a voltage divider for VCC with the FSET pin 507 forming the intermediate voltage divider node. The capacitor CSET charges from VREF to a steady-state voltage of V1=VCC*(RSET/(RSET+RUV)) (where the forward slash "/" denotes division). If the over-current fault condition occurs, PGOOD and PGOOD' are de-asserted and FOC is asserted so that the resistor ROC and the parallel combination of RSET and CSET form a voltage divider for VCC with the FSET pin 507 forming the intermediate voltage divider node. In this case, the capacitor CSET charges from VREF to a steady-state voltage of V2=VCC*

(RSET/(RSET+ROC)). If the input voltage out-of-range fault condition occurs, PGOOD is de-asserted and FPOR is asserted so that the resistor RPOR and the parallel combination of RSET and CSET form a voltage divider for VCC with the FSET pin 507 forming the intermediate voltage divider node. In this case, the capacitor CSET charges from VREF to a steady-state voltage of V3=VCC*(RSET/(RSET+RPOR)). The resistors RUV, ROC and RPOR are again differently sized to provide three separate and distinguishable charging rates and three separate and distinguishable steady-state voltage levels externally detectable and measurable at the FSET pin 507. In one embodiment, for example, VCC is approximately 5.0V and the resistors RUV, ROC and RPOR are differently sized by a factor of ten, such as RUV=100 kΩ, ROC=10 kΩ, and RPOR=1 kΩ, resulting in corresponding slow, medium and fast charge rates of the capacitor CSET and corresponding approximate steady-state voltages of V1=1.9V, V2=4.3V and V3=5V.

Figure 6:
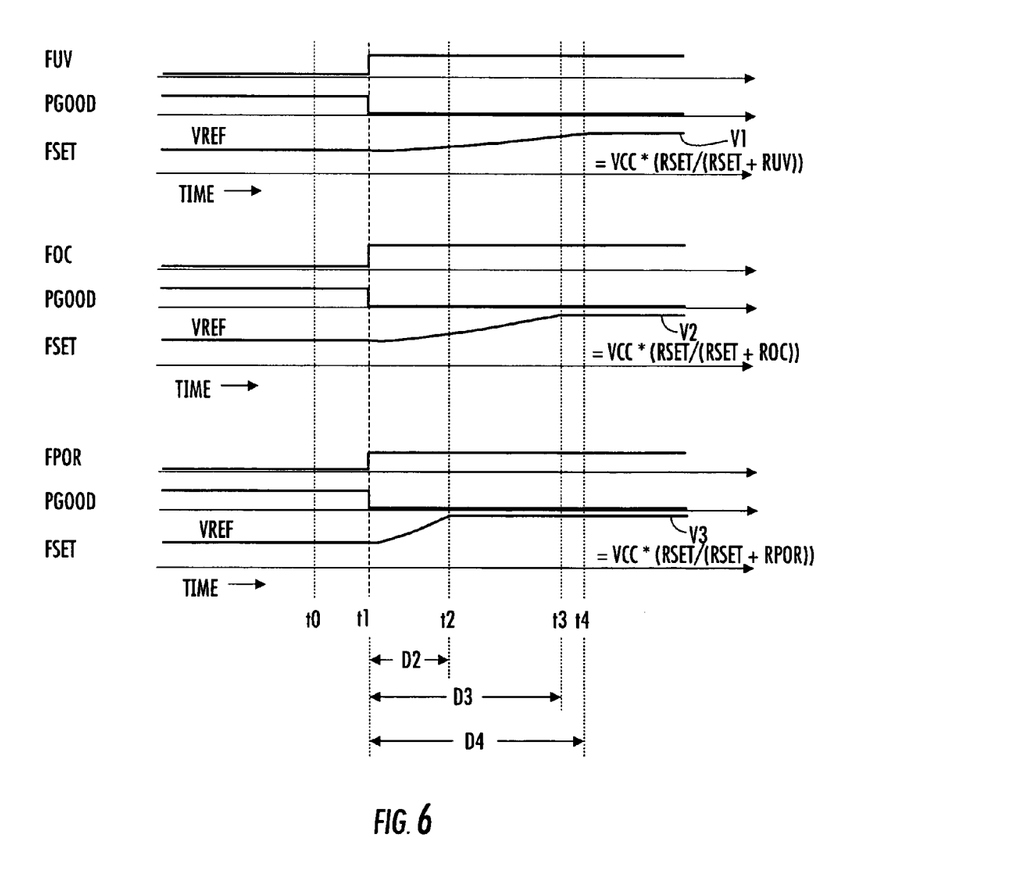
FIG. 6 includes three timing diagrams illustrating operation of the exemplary fault indicator system of the IC of FIG. 5 for the three separate fault condition cases, namely, the output over-voltage fault condition, the over-current fault condition, and the input voltage out-of-range fault condition, respectively.

FIG. 6 includes three timing diagrams illustrating operation of the exemplary fault indicator system of the IC 500 for the three separate fault condition cases, namely, the output over-voltage fault condition, the over-current fault condition, and the input voltage out-of-range fault condition, respectively, in a similar manner as the timing diagrams of FIGS. 2 and 4 for the ICs 100 and 300, respectively. In each timing diagram, a corresponding one of the fault signals FUV, FOC and FPOR is plotted versus time followed by plots of PGOOD and the voltage of the FSET pin 503, shown as a signal FSET. Again, the three timing diagrams are aligned with each other to more clearly contrast three different charging rates of the capacitor CSET and the different steady-state voltage levels developed on the FSET pin 507 as a result of the corresponding fault condition. In each case, at an initial time t0 during normal operation, the voltage of the FSET pin 503 is at VREF, such as, for example, 0.9V. In the first timing diagram, at a time t1 the FUV signal is asserted high indicating the output under-voltage fault condition. The PGOOD signal is de-asserted low at time t1 and the FSET pin 507 begins charging to reach the new steady-state voltage V1 at time t4. The rate of discharge of the capacitor CSET is governed by equation 1 above, except that τ is based on the resistors RSET and RUV and the capacitor CSET when discharged through the resistors RSET and RUV. Thus, the capacitor CSET and the resistors RSET and RUV determine the duration from time t1 to time t4, shown as D4, which is a relatively long duration since RUV has a relatively large resistance.

In the second timing diagram, at time t1 the FOC signal is asserted high indicating the over-current fault condition. The PGOOD signal is de-asserted low at time t1 and the voltage of the FSET pin 507 begins charging to reach the new steady-state voltage V2 at time t3. The rate of discharge of the capacitor CSET is governed by equation 1 above, except that τ is based on the resistors RSET and ROC and the capacitor CSET when discharged through the resistors RSET and ROC. Since the capacitor CSET is unchanged and since ROC is significantly smaller than RUV, the RC time constant for ROC is significantly shorter so that the duration from time t1 to time t3, shown as duration D3, is shorter than D4. Also, since ROC is smaller, V2 is greater than V1.

In the third timing diagram, at time t1 the FPOR signal is asserted high indicating the over-current fault condition. The PGOOD signal is de-asserted low at time t1 and the voltage of the FSET pin 507 begins charging to reach the new steady-state voltage V3 at time t2. The rate of discharge of the capacitor CSET is governed by equation 1 above, except that τ is based on the resistors RSET and RPOR and the capacitor CSET when discharged through the resistors RSET and RPOR. Since the capacitor CSET is unchanged and since RPOR is significantly smaller than ROC, the RC time constant for RPOR is significantly shorter so that the duration from time t1 to time t2, shown as duration D2, is shorter than D3. Also, since RPOR is smaller, V3 is greater than V2. Since RPOR is significantly smaller than RSET in the exemplary configuration shown, V3 is approximately equal to VCC. The duration D2 is shorter than the duration D3 and significantly shorter than the duration D4, resulting in a measurable timing or charging rate characteristic. In addition, the steady-state voltages V1, V2 and V3 are sufficiently different (e.g., 1.9V, 4.3V and 5V) providing a measurable voltage level characteristic, where either one or a combination of both the charge rate and voltage level characteristics may be used to identify the type of fault protection. In this manner, three different charging rates and/or voltage levels are used, where each signature is associated with a corresponding fault condition.

Figure 7:
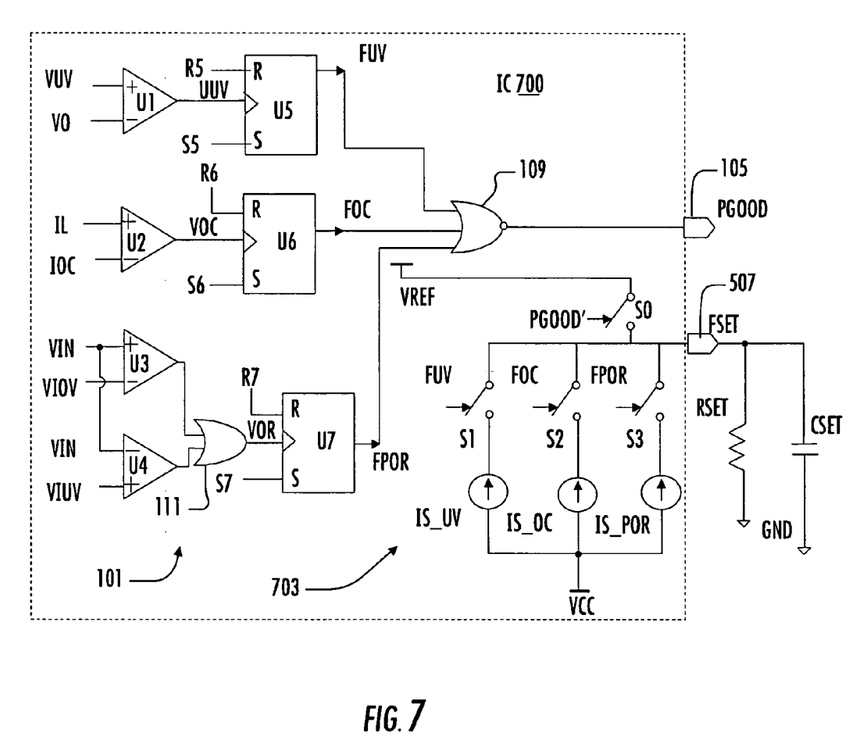
FIG. 7 is simplified schematic diagram of a power management chip or IC including an exemplary fault indicator system according to another embodiment of the present invention.

FIG. 7 is simplified schematic diagram of a power management chip or IC 700 including an exemplary fault indicator system according to another embodiment of the present invention. Similar components as those of the ICs 100, 300 and 500 assume identical reference numbers. The IC 700 includes the detection system 101 that operates in substantially identical manner as that of the IC 100 as previously described. The IC 700 employs a signal signature system 703, which is internally similar to the signal signature system 303 including current sources IS_UV, IS_OC and IS_POR, except that the switches S1-S3 are internally coupled to the external pin FSET in a similar manner as the signal signature system 503. The FSET pin 507 operates in the same manner as described above for the IC 500 during normal operation, which is internally coupled through the switch S0 to VREF and externally coupled to the parallel combination of RSET and CSET as previously described for setting the frequency of operation. In this case, a selected one of the current sources IS_UV, IS_OC and IS_POR provides current to RSET and CSET via the dual purpose FSET pin 507 in the event of the corresponding fault condition.

Figure 8:
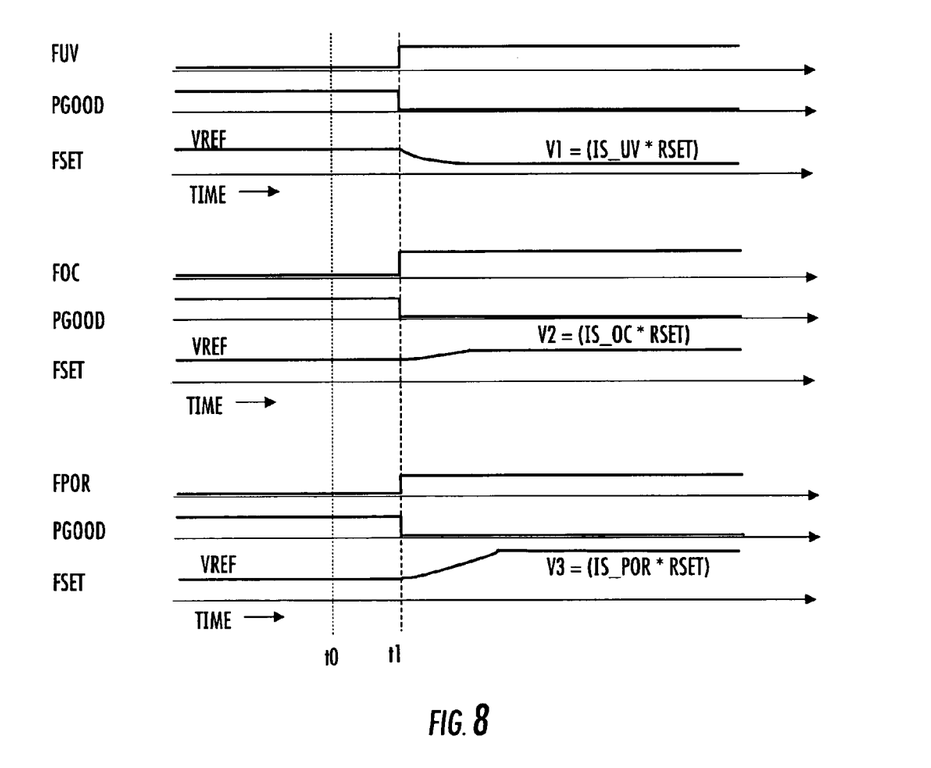
FIG. 8 includes three timing diagrams illustrating operation of the exemplary fault indicator system of the IC for the three separate fault condition cases, namely, the output over-voltage fault condition, the over-current fault condition, and the input voltage out-of-range fault condition, respectively.

FIG. 8 includes three timing diagrams illustrating operation of the exemplary fault indicator system of the IC 700 for the three separate fault condition cases, namely, the output over-voltage fault condition, the over-current fault condition, and the input voltage out-of-range fault condition, respectively, for the IC 700. In each timing diagram, a corresponding one of the fault signals FUV, FOC and FPOR is plotted versus time followed by plots of PGOOD and the FSET signal. Again, the three timing diagrams are aligned with each other to more clearly contrast three different voltage levels developed on the FSET pin 507 as a result of the corresponding fault condition. In each case, at an initial time t0 during normal operation, the voltage of the FSET pin 507 is at VREF. In each case, voltage of the FSET pin 507 charges to one of the voltage levels V1, V2 or V3 in a similar manner as described for the IC 300 depending upon the particular type of fault condition that occurred. The final steady state voltage levels of V1, V2 and V3 are the same as that of the IC 300, namely V1=(IS_UV*RSET), V2=(IS_OC*RSET), and V3=(IS_POR*RSET). Assuming similar values for the current sources and RSET, the final steady state voltage levels of V1, V2 and V3 are also the same, namely V1=0.6V, V2=1.2V, and V3=2.4V. A difference in the case of the IC 700 as compared to the IC 300 is the presence of CSET, so that the voltages V1-V3 are reached after a capacitive charging delay. The duration of the delay is substantially similar in each case, so that the voltage levels are used to distinguish between the different fault conditions rather than charging rates.

Figure 9:
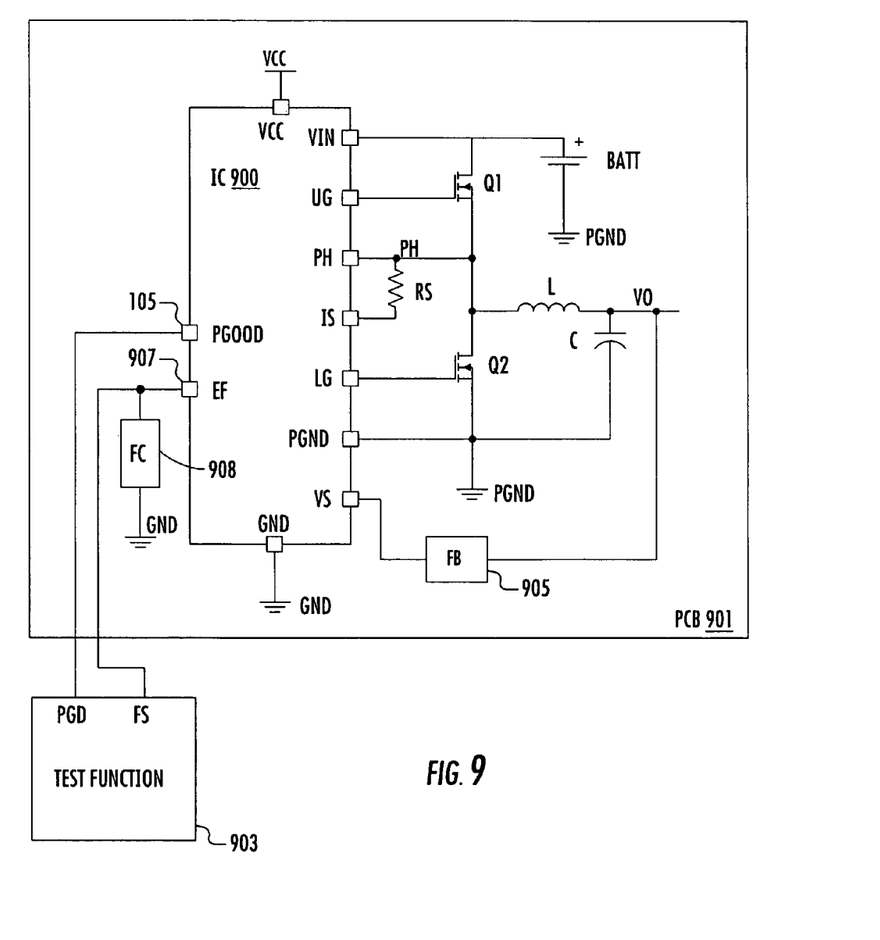
FIG. 9 is a schematic and block diagram of an exemplary power management circuit implemented according to an embodiment of the present invention interfacing test apparatus for identifying one of multiple fault conditions.

FIG. 9 is a schematic and block diagram of an exemplary power management circuit implemented according to an embodiment of the present invention interfacing test apparatus for identifying one of multiple fault conditions. An IC 900 incorporating a power management circuit is installed or mounted onto a printed circuit board (PCB) 901 or the like, such as a motherboard or expansion board as known to those skilled in the art for use with various computing devices, such as notebook computers, desktop computers, handheld devices, tablet PCs or slates, etc. The present invention may be employed for a power controller for any type of electronic device, including line-powered or battery-powered devices. The IC 900 may be implemented according to any of the embodiments previously described, such as the ICs 100, 300, 500 or 700, including a fault indicator system implemented according to an embodiment of the present invention. In one exemplary test configuration, the PCB 901 is plugged into a test fixture (not shown) which interfaces the PCB 901 to a test function 903. Alternatively, the test function 903 is incorporated onto the PCB 901.

In the illustrated embodiment, the IC 900 is PWM controller for a buck-mode type power supply, including electronic switches Q1 and Q2 coupled in series between the input voltage VIN and a power ground PGND. The electronic switches Q1 and Q2 are shown as metal-oxide-semiconductor, field-effect transistors (MOSFETs), although other types of electronic switching devices are contemplated. As illustrated, the drain of Q1 is coupled to VIN, its source is coupled to a phase node PH, which is coupled to the drain of Q2. The source of Q2 is coupled to PGND, which is fed back to the IC 900 via a corresponding PGND pin. The PH node is coupled to a PH pin of the IC 900 and to one end of an inductor L, having its other end developing the output voltage V0 and coupled to an output filter capacitor C. The other end of C is coupled to PGND. VIN may be developed by a battery BATT referenced to PGND, although a DC source derived from line voltage or another power regulator is contemplated as well. The IC 900 includes a VIN pin receiving the VIN voltage, although VIN may alternatively be indirectly sensed by the PH pin coupled to the PH node. The IC 900 includes an upper gate (UG) pin for driving the gate of Q1 and a lower gate (LG) pin for driving the gate of Q2. A current sense resistor RS may be provided and coupled between the PH pin and a current sense (IS) pin of the IC 900 for sensing output or inductor current. V0 is provided to a feedback circuit 905, which provides a feedback signal to a voltage sense (VS) pin of the IC 900 for sensing V0. The IC 900 receives power from the voltage source VCC provided to a VCC pin referenced to GND via a GND pin.

The IC 900 includes the PGOOD pin 105 coupled to a PGD input of the test function 903. The IC 900 further includes an existing external pin EF 907 for performing a power controller function as previously described, which is coupled to one or more external function components 908 coupled to GND. The EF pin 907 is used as the dual purpose pin and represents any one of the existing pins of the IC 900 as previously described, such as the SOFT pin 107, the OCSET pin 307, the FSET pin 507, etc., where the external component circuit 908 includes any one or more of the corresponding external components previously described, such as CSOFT, RSET, CSET, etc. The EF pin 907 is provided to a fault signature (FS) input of the test function 903.

The test function 903 includes the appropriate conversion, detection, timing and/or measurement circuitry or logic (not shown) for sensing and identifying the signature of the fault signal asserted on the EF pin in the event of a fault condition. Any combination of analog-to-digital converters (ADCs), comparator circuits, timing circuits, counter circuits, storage circuits, etc. (not shown), may be employed for detecting and identifying the fault signature may be used as known to those skilled in the art. In operation, the test function 903 detects the occurrence of a fault condition via the PGD input when the PGOOD signal is de-asserted low. The FS input is monitored to identify the fault condition causing the fault protection. For example, for the IC 100 or 500, a timing or counter circuit or the like is used to determine the amount of time the FS input (e.g., SOFT or FSET signal) takes to reach a predetermined voltage level (e.g., GND) or a selected one of multiple predetermined voltage levels. For the ICs 300, 500 or 700, the FS input may be converted to a digital value which is latched at the appropriate time and stored for later retrieval by test logic. It is understood that the particular configuration and implementation of the test function 903 depends upon the particular fault indicator system and fault signatures employed.

It is appreciated that a fault indicator system for power management circuits according to an embodiment of the present invention re-uses an existing pin on the IC or chip, normally used to perform a power management function during normal operation, to perform an additional function of reporting different fault conditions using corresponding fault signatures that identify the type of protection fault. As illustrated, several different types of existing pins may be used for the dual purpose, particularly those for coupling to external passive devices which are used to develop a characteristic signal. The dual purpose pin is internally switched from its normal function to one or more internal devices based on the fault condition detected, which cooperate with the external device(s) to develop the unique characteristic waveforms or voltage levels.

Many alternatives and variations are possible without departing from the spirit and scope of the present invention. Although only one dual purpose pin is shown and described in the various embodiments, any number of dual purpose pins may be employed. Although binary charging/discharging rates are illustrated, it is understood that other charging arrangements are contemplated, such as, for example, linear charging and discharging rates. The switches are shown and described as SPST switches, which may be implemented as electronic FET switches or the like as known to those skilled in the art. The switches S1-S3 may instead couple the existing IC pin to predetermined static voltage levels for charging external capacitors or applied to external resistors or combinations thereof. In some embodiments, the normal function may remain connected (e.g., eliminating the switch S0). For example, instead of disconnecting the current source 113 from the SOFT pin 107 for the IC 100, the current may be applied in combination with other internal current sources (e.g., IS_UV, IS_OC, IS_POR, etc.) to modify the voltage of CSOFT by a measurable amount to a characteristic voltage level. The switch S0 can be replaced with a single-pole, double-throw (SPDT) switch to switch VREF or VCC to a voltage divider network further programmed by another switching network (e.g., switches S1-S3) using the fault signals to develop the different fault signatures on the external pin.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. A power management integrated circuit (IC), comprising:
- a dual purpose pin that performs a power management function during normal operation;
- a fault detection system that senses a plurality of fault conditions and that provides a corresponding plurality of fault indicator signals, each fault indicator signal indicating a corresponding fault condition;
- a fault signature system, coupled to said dual purpose pin, that generates a selected one of a plurality of fault signature signals on said dual purpose pin in response to said fault detection system providing a corresponding one of said plurality of fault indicator signals, each fault signature signal having a characteristic uniquely identifying only one of said plurality of fault conditions;
- at least one external component coupled to said dual purpose pin;
- a plurality of internal components, each corresponding to one of said plurality of fault conditions; and
- a switch circuit which internally couples said dual purpose pin to a corresponding one of said plurality of internal components in response to assertion of a corresponding one of said plurality of fault indicator signals;
- wherein each of said plurality of fault signature signals, when generated, is generated only said dual purpose pin.

2. The power management IC of claim 1, wherein each of said plurality of fault signature signals has a unique signal waveform indicative of a corresponding fault condition.

3. The power management IC of claim 1, wherein each of said plurality of fault signature signals develops a unique voltage level indicative of a corresponding fault condition.

4. The power management IC of claim 1, wherein said fault detection system comprises a plurality of sensors, each comprising a comparator and a latch.

5. The power management IC of claim 1, wherein said fault detection system comprises:
- a first comparator that compares an output voltage with an output under-voltage threshold and that provides an output under voltage signal to a first latch providing a first fault indicator signal;
- a second comparator that compares a sense current with an over-current threshold and that provides an over current signal to a second latch providing a second fault indicator signal;
- a third comparator that compares an input voltage with an input over-voltage threshold and that provides an input over-voltage signal;
- a fourth comparator that compares said input voltage with an input under-voltage threshold and that provides an input under-voltage signal; and
- a logic gate that receives said input over-voltage and input under-voltage indicator signals and that provides an input voltage out-of-range signal to a third latch providing a third fault indicator signal.

6. The power management IC of claim 1, wherein each fault indicator signal controls a corresponding one of said plurality of switches to create a selected combination of said at least one external component and said plurality of internal components to generate a selected one of said plurality of fault signature signals on said dual purpose pin.

7. The power management IC of claim 6, wherein each selectable combination is a resistive-capacitive combination with a unique timing constant.

8. The power management IC of claim 6, wherein each selectable combination is a voltage divider combination that develops a unique voltage level.

9. The power management IC of claim 6, wherein each selectable combination is a resistive and current source combination that achieves a characteristic voltage level.

10. The power management IC of claim 1, wherein said fault signature system comprises:
- said at least one external component comprising a capacitor;
- a gate receiving said plurality of fault indicator signals and providing a power good signal;
- a power good switch, responsive to said power good signal, that couples said dual purpose pin to a current source to charge said capacitor when said power good signal is asserted during normal operation, said power good switch removing said current source from said dual purpose pin when said power good signal is de-asserted; and
- said plurality of internal components comprising a plurality of resistors.

11. The power management IC of claim 1, wherein said fault signature system comprises:
- said at least one external component comprising a resistor; and
- said plurality of internal devices comprising a plurality of current sources, each developing a characteristic voltage level when coupled to said resistor.

12. The power management IC of claim 1, wherein said fault signature system comprises:
- said external device comprising a set resistor and a set capacitor coupled in parallel to said dual purpose pin;
- a gate receiving said plurality of digital fault indicator signals and providing a power good signal;
- a power good switch, responsive to said power good signal, that couples said dual purpose pin to a reference voltage when said power good signal is asserted during normal operation, said power good switch removing said reference voltage from said dual purpose pin when said power good signal is de-asserted; and
- said plurality of internal components comprising a plurality of internal resistors, each having a first terminal coupled to an internal voltage source and a second terminal coupled to a corresponding one of said plurality of switches.

13. The power management IC of claim 1, wherein said fault signature system comprises:
- said at least one external component comprising a resistor and capacitor coupled in parallel to said dual purpose pin;
- a gate receiving said plurality of digital fault indicator signals and providing a power good signal;
- a power good switch, responsive to said power good signal, that couples said dual purpose pin to a reference voltage when said power good signal is asserted during normal operation, said power good switch removing said reference voltage from said dual purpose pin when said power good signal is de-asserted; and
- said plurality of internal components comprising a plurality of current sources.

14. A power system, comprising:
- a printed circuit board (PCB);
- a power switching circuit, mounted on said PCB, that converts an input voltage to a regulated output voltage; and
- a power management chip, mounted on said PCB and coupled to control said power switching circuit, comprising:
  - a dual purpose pin;
  - a plurality of internal components; and a switch circuit which couples a selected one of said plurality of internal components to said dual purpose pin;

wherein said dual purpose pin performs a power management function during normal operation and is selectively coupled to one of said plurality of internal components to provides a corresponding one of a plurality of fault signature signals in response to a corresponding one of a plurality of fault protection modes, each of said plurality of fault signature signals uniquely identifying only one of said plurality of fault protection modes, and wherein each of said plurality of fault signature signals, when provided, is provided only on said dual purpose pin.

15. The power system of claim 14, wherein said dual purpose pin is a soft start pin, coupled to a capacitor, which charges to a predetermined voltage level during normal operation and which discharges at a characteristic rate indicative of a fault protection mode.

16. The power system of claim 14, wherein said dual purpose pin is an over current set pin, coupled to a set resistor, which develops a characteristic voltage level indicative of a fault protection mode.

17. The power system of claim 14, wherein said dual purpose pin is a frequency set pin, coupled to a resistor and a capacitor, which develops a characteristic voltage level indicative of a fault protection mode.

18. The power system of claim 14, wherein said dual purpose pin is a frequency set pin, coupled to a resistor and a capacitor, which develops an initial voltage during normal operation and which charges at a characteristic rate indicative of a fault protection mode.

19. The power system of claim 14, further comprising:
said power management chip including a power good pin that is asserted high during normal operation and that is de-asserted low during any of said plurality of fault protection modes; and
a test function, coupled to said power management chip, that determines a corresponding one of said plurality of fault signature signals provided on said dual purpose pin when said power good pin is de-asserted low.

20. A method of indicating specific fault information of a power management chip by re-using an external pin of the chip that normally performs a predetermined power management function, comprising:
internally detecting each of a plurality of fault conditions;
generating a corresponding one of a plurality of fault signals on the external pin in response to detecting any of the plurality of fault conditions, each of the plurality of fault signals having a unique signature which identifies only one of the plurality of fault conditions;
coupling an external device associated with the predetermined power management function to the external pin;
wherein said generating a fault signal comprises internally coupling the external pin to a corresponding one of a plurality of unique internal devices; and
wherein each of the plurality of fault signals, when generated, is generated only on the external pin.

21. The method of claim 20, wherein said internally detecting comprises:
comparing each of a plurality of power management signals with a corresponding plurality of reference thresholds; and
providing a plurality of fault indications, each indicative of a corresponding power management signal meeting its reference threshold.

22. The method of claim 20, wherein said internally coupling the external pin to a corresponding one of a plurality of unique internal devices comprises coupling to at least one source device which causes a corresponding one of a plurality of unique voltage levels to develop on the external pin.

23. The method of claim 22, wherein said coupling to at least one source device comprises coupling to a corresponding one of a plurality of unique source devices.

24. The method of claim 22, wherein said internally coupling the external pin to a corresponding one of a plurality of unique internal devices comprises coupling to a corresponding one of a plurality of unique voltage divider devices coupled to a voltage source.

25. The method of claim 20, further comprising:
applying a predetermined condition associated with the predetermined power management function on the external pin; and
wherein said internally coupling the external pin to a corresponding one of a plurality of unique internal devices comprises changing the predetermined condition in a unique manner.

26. The method of claim 25, wherein said applying a predetermined condition comprises charging to an initial voltage level and wherein said changing the predetermined condition comprises discharging voltage at a unique rate.

27. The method of claim 25, wherein said applying a predetermined condition comprises applying an initial voltage level and wherein said changing the predetermined condition comprises changing to a unique voltage level.

28. The method of claim 25, wherein said applying a predetermined condition comprises applying an initial voltage level and wherein said changing the predetermined condition comprises changing voltage level at a unique rate.

29. The method of claim 25, further comprising:
said applying a predetermined condition comprising coupling a source device to the external pin; and
decoupling the source from the external pin in response to said providing a corresponding one of a plurality of fault indications.

* * * * *